United States Patent
Shinomiya et al.

(10) Patent No.: US 6,492,278 B2
(45) Date of Patent: Dec. 10, 2002

(54) METHOD OF MANUFACTURING SEMICONDUCTOR DEVICE

(75) Inventors: Hideo Shinomiya, Yokohama (JP); Shoji Seta, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 158 days.

(21) Appl. No.: 09/742,116

(22) Filed: Dec. 22, 2000

(65) Prior Publication Data

US 2001/0021586 A1 Sep. 13, 2001

(30) Foreign Application Priority Data

Mar. 13, 2000 (JP) ........................................ 2000-069230

(51) Int. Cl.⁷ .................... H01L 21/302; H01L 21/3065
(52) U.S. Cl. ...................... 438/706; 438/723; 438/724; 438/725
(58) Field of Search ................ 438/706, 723, 438/725, 724

(56) References Cited

U.S. PATENT DOCUMENTS 5,219,787 A * 6/1993 Carey et al. ................. 438/637
5,382,315 A * 1/1995 Kumar ......................... 216/39

FOREIGN PATENT DOCUMENTS

JP          7-169739         7/1995

OTHER PUBLICATIONS

Kim, Method for forming metal line of semiconductor device, Jul. 6, 2001, (English Abstract or KR 2001060045 A) 3 pages.*

* cited by examiner

Primary Examiner—Felisa Hiteshew
Assistant Examiner—Lynette T. Umez-Eronini
(74) Attorney, Agent, or Firm—Oblon, Spivak, McClelland, Maier & Neustadt, P.C.

(57) ABSTRACT

A second resist film is formed on a first resist film and then patterned. Thereafter, an SOG film is formed on the entire surface of the resultant structure to cover the second resist film. Subsequently, the SOG film and the second resist film and the first resist film are removed to pattern the SOG film and the first resist film. After that, using the patterned the first resist film as a mask, a trench is formed.

17 Claims, 5 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2000-069230, filed Mar. 13, 2000, the entire contents of which are incorporated herein by reference.

BACKGROUND OF THE INVENTION

The present invention relates to a method of manufacturing a semiconductor device characterized by comprising a step of patterning a film such as an insulating film by using a masking material.

When a micro pattern is formed by a conventional method, an insulating film or a metal film is processed by using a patterned resist as a mask. The method of micro-processing the insulating film will be explained with reference to FIGS. 11 to 14.

First, as shown in FIG. 11, a first resist film 22 is formed on an insulating film 21 and subsequently a Spin-On-Glass (SOG) film 23 is formed on the first resist film 22. A second resist film 24 is coated on the SOG film 23, followed by being patterned.

Subsequently, as shown in FIG. 12, the SOG film 23 is removed until the surface of the first resist film 22 is exposed. As a result, the SOG film 23 is patterned. During this process, the resist film 24 is partly removed.

As a next step, as shown in FIG. 13, using the patterned SOG film 23 as a mask, the first resist film 22 is removed until the surface of the insulating film 21 is exposed. In this way, the first resist film 22 is patterned. In the patterning process, the second resist film 24 is also removed. After that, the patterned SOG film 23 is removed.

Subsequently, as shown in FIG. 14, using the patterned first resist film 22 as a mask, the insulating film 21 is removed by dry etching. As a result, a trench 25 is formed in the insulating film 21.

In the aforementioned conventional method, the trench 25, which must be finely processed, is formed by using the patterned first resist film 22 as a mask.

Since the micro-processing requires improvement in resolution, the thickness of the first resist film 22 serving as a mask has to be reduced. On the other hand, to form a fine trench 25 by dry etching using the first resist film 22 as a mask, the first resist film 22 serving as a mask must have a thickness sufficient to ensure an appropriate etching selective ratio.

Therefore, a micro-processing method is required for stably processing a film such as the insulating film while ensuring a sufficient lithographic margin and a sufficient film thickness of a masking material during dry etching.

BRIEF SUMMARY OF THE INVENTION

The present invention was made to overcome the aforementioned problems. An object of the present invention is to provide a method of manufacturing a semiconductor device by micro-processing while ensuring a sufficient lithographic margin and a sufficient film thickness of a masking material during dry etching.

The present invention employs the following means to attain the aforementioned object.

The method of manufacturing a semiconductor device of the present invention comprises the steps of:

forming a first organic layer on an insulating film;

forming a second organic layer on the first organic layer;

patterning the second organic layer;

forming a silicon oxide film or a metal-containing inorganic film on an entire surface of the patterned second organic layer, thereby covering the second organic layer;

removing the silicon oxide film or the metal-containing inorganic film, the second organic layer, and the first organic layer, by dry etching, thereby patterning the first organic layer and the silicon oxide film or the metal-containing inorganic film;

removing the silicon oxide film or the metal containing inorganic film and the insulating film by using the patterned first organic layer as a mask, thereby exposing the surface of the patterned first organic layer and simultaneously forming a trench in the insulating film; and removing the first organic layer.

Furthermore, another method of manufacturing a semiconductor device according to the present invention may further comprise a step of forming an anti-reflection film on the first organic layer after the first organic layer is formed. The anti-reflection film used herein is an organic anti-reflection film formed of flare, silk, polyimide, fluorocarbon, or tri-acetylene.

The first organic layer is formed of a resist film, a coating-type carbon film, a sputtering-type carbon film, or a low dielectric film.

It is desirable that the silicon oxide film should be one selected from the group consisting of an SOG film, coating-type organic silicon oxide film, coating type organic silicon film, or coating-type inorganic silicon film.

It is desirable that the metal-containing inorganic layer should contain a coating-type inorganic layer containing at least one metal selected from the group consisting of $WO_3$, $Al_2O_3$, $TiO_2$, and TiN.

The second organic layer is a negative resist film. Furthermore, the second organic layer is patterned by electron beam drawing. Moreover, the second organic layer is thinner than the first organic layer.

Another method of manufacturing a semiconductor device of the present invention may further comprise a step of irradiating the entire surface of the resulting structure with ultraviolet rays after the second organic layer is patterned.

As explained above, according to the present invention, it is possible to provide a method of manufacturing a semiconductor device by micro-processing while ensuring a sufficient lithographic margin and a film thickness of a mask material during dry etching.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred-embodiments of the invention, and together with the general description given above and the detailed description of the preferred embodiments given below, serve to explain the principles of the invention.

DETAILED DESCRIPTION OF THE INVENTION

Embodiments of the present invention will be explained with reference to the accompanying drawings.

FIGS. 1 to 7 are cross-sectional views showing manufacturing steps of a semiconductor device according to the present invention. Referring now to FIGS. 1 to 7, we will explain a micro-processing method of an insulating film.

Figure 1:
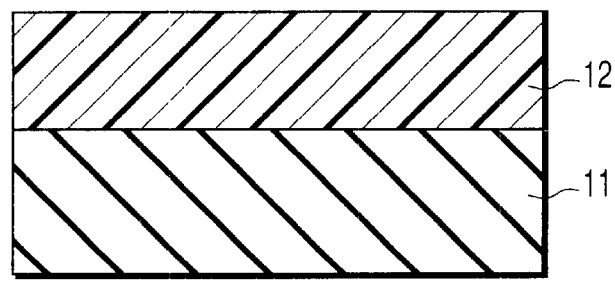
FIG. 1 is a cross-sectional view showing a manufacturing step of a semiconductor device according to the present invention.

As shown in FIG. 1, a first resist film 12 of, e.g., 500–1000 nm thick is formed on an insulating film 11. Thereafter, the resultant structure is subjected to baking at a temperature of about 200–300° C. In this manner, an underlying layer is formed. Any organic film may be used herein as the first resist film 12. More specifically, as the organic film, a coating-type carbon film, a sputtering-type carbon film, or a low dielectric film including silk or a hydrocarbon series film, are desirably employed.

Figure 2:
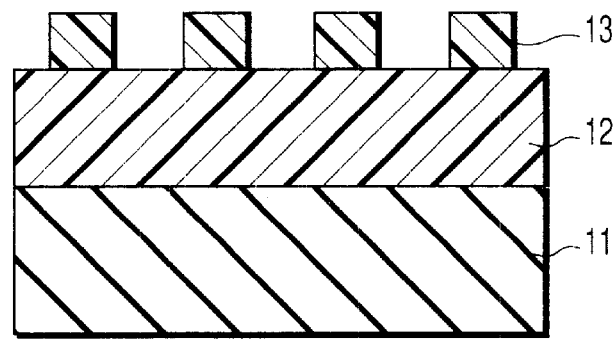
FIG. 2 is a cross-sectional view showing a manufacturing step following FIG. 1 of a semiconductor device according to the present invention.

As shown in FIG. 2, a second resist film 13 of 50–300 nm thick is formed on the first resist film 12. The second resist film 13 is patterned by a method such as electron beam drawing.

As the second resist film 13 used herein, a negative resist suitable for micro-patterning may be used. As the negative resist, it is desirable to use a chemically amplified resist containing polyvinylphenyl, a melamine resin, a photoacid generating agent (SNR200, manufactured by Shipley), and a resist (RD-2000N, manufactured by Hitachi Chemical Co., Ltd.) consisting of polyvinylphenol and a bisazide compound.

The second resist film 13 is thinner than the first resist film 12. Furthermore, the thinner the second resist film 13, the better, as long as the underlying film can be etched accurately and the second resist film is etched with a sufficient etching selective ratio so as to obtain a pattern having a fine opening portion.

If the second resist film 13 is patterned by electron beam drawing, a finer patterning can be made than the case in which the second resist film 13 is patterned by a laser beam.

Figure 3:
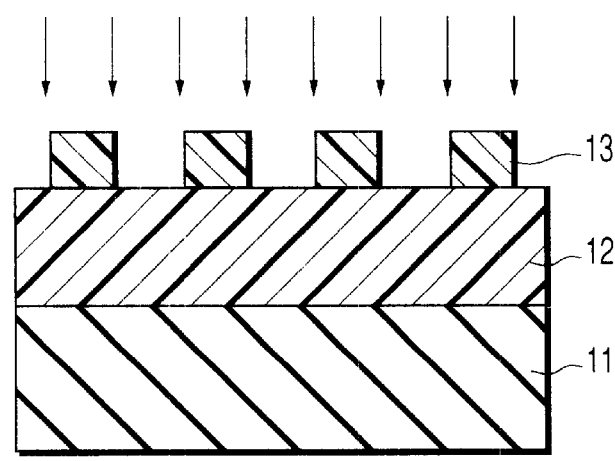
FIG. 3 is a cross-sectional view showing a manufacturing step following FIG. 2 of a semiconductor device according to the present invention.

Next, as shown in FIG. 3, the entire surface of the resultant structure is irradiated with ultraviolet rays to reform the exposed surface of the second resist film 13.

Figure 4:
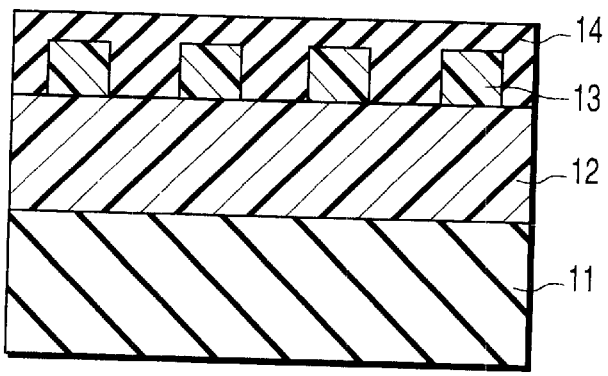
FIG. 4 is a cross-sectional view showing a manufacturing step following FIG. 3 of a semiconductor device according to the present invention.

Subsequently, as shown in FIG. 4, a Spin-On-Glass (SOG) film 14 is formed over the entire surface of the resultant structure, thereby covering the second resist film 13. After that, the resultant structure is baked at a high-temperature of e.g., 200° C. In this case, in place of the SOG film 14, the following films may be used which include a coating-type organic silicon oxide film, a coating-type organic silicon film (polysilane), a coating-type inorganic silicon film, and a coating-type inorganic film containing at least one metal selected from the group consisting of $WO_3$, $Al_2O_3$, $TiO_2$, and TiN.

Figure 5:
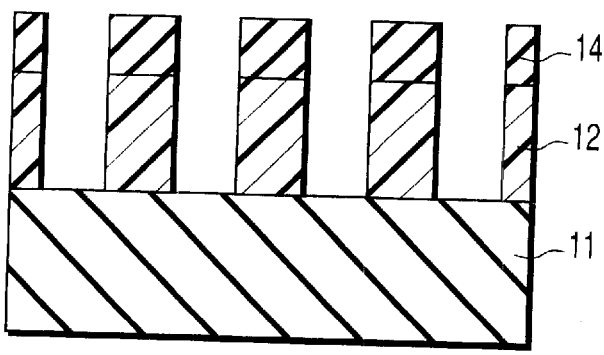
FIG. 5 is a cross-sectional view showing a manufacturing step following FIG. 4 of a semiconductor device according to the present invention.

Subsequently, as shown in FIG. 5, the SOG film 14, the second resist film 13, and the first resist film 12 are removed by dry etching such as Reactive Ion Etching (RIE) under etching condition 1 where the etching rate of the SOG film 14 is slower than that of the first resist film 12. As a result, the surface of the insulating film 11 is exposed. This etching process is hereinafter referred to as the "RIE process". In the RIE process, the patterned first resist film 12 is formed on the insulating film 11 by using a part of the SOG film 14 as a mask.

Figure 6:
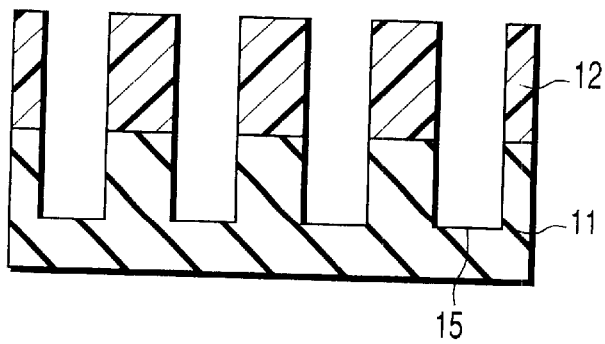
FIG. 6 is a cross-sectional view showing a manufacturing step following FIG. 5 of a semiconductor device according to the present invention.

Thereafter, as shown in FIG. 6, using the patterned first resist film 12 as a mask, the SOG film 14 and the insulating film 11 are removed under etching condition 2 where the etching rate of the insulating film 11 is faster than that of the first resist film 12.

Consequently, the surface of the patterned first resist film 12 is exposed, and simultaneously, a trench 15 is formed in the insulating film 11.

Figure 7:
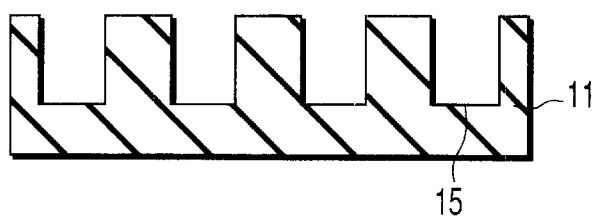
FIG. 7 is a cross-sectional view showing a manufacturing step following FIG. 6 of a semiconductor device according to the present invention.

After that, as shown in FIG. 7, the first resist film 12 is removed by plasma treatment performed in an oxygen atmosphere.

According to the embodiment mentioned above, the SOG film 14 is first patterned under etching condition 1, and then the first resist film 12 is patterned using the patterned SOG film 14 as a mask. Therefore, when the insulating film 11 under the first resist film 12 is etched, the first resist film 12 ensures enough thickness for a mask material. Furthermore, the trench 15 is formed based on the size of the patterned second resist film 13. Therefore, it is possible to process the trench 15 with accurate processing dimensions. Hence, the micro-processing of the trench 15 is attained. As described above, according to the present invention, it is possible to provide a method of manufacturing a semiconductor device by micro-processing, while ensuring a sufficient lithographic margin and a sufficient film thickness of the masking material during dry etching.

Figure 8:
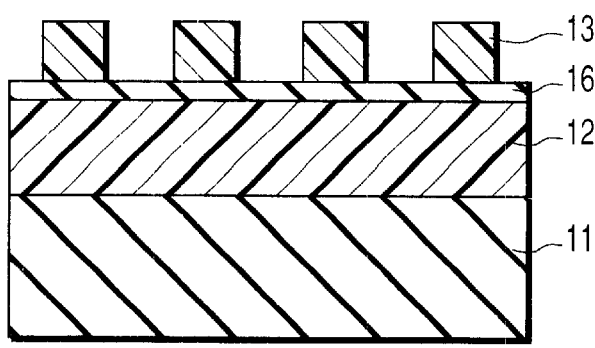
FIG. 8 is a cross-sectional view showing a manufacturing step following FIG. 1 of a semiconductor device having an anti-reflection film formed therein.

Note that, as shown in FIG. 8, after the first resist film 12 is formed, an organic anti-reflection film 16 may be formed on the first resist film 12, which includes flare, silk, polyimide, fluorocarbon, or tri-acetylene, or the like. Even if the organic anti-reflection film 16 is formed, the same effect as mentioned above can be obtained. Furthermore, it is possible to prevent a negative effect, that is, the degradation of the second resist film 13 caused by mutual interference between solvents in the first and second resist films 12, 13, at a contact surface of the first resist film 12 and the second resist film 13.

Figure 9:
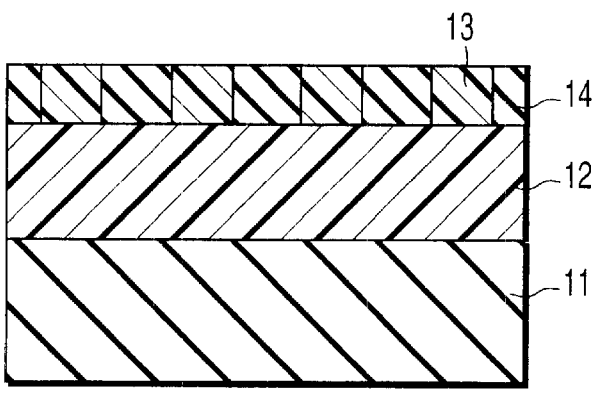
FIG. 9 is a cross-sectional view showing a manufacturing step following FIG. 4 of a semiconductor device, in which a RIE process is performed in two steps.

The RIE process mentioned above may be performed in two steps. To be more specific, as shown in FIG. 9, the SOG film 14 is etched-back under processing conditions where the etching rate of the second resist film 13 is slower than that of the SOG film 14, until the surface of the second resist film 13 is exposed, and thereafter, the second resist film 13 and the first resist film 12 may be removed by dry etching. Alternatively, the SOG film 14 is removed by chemical mechanical polishing (CMP) until the surface of the second resist film 13 is exposed, and thereafter, the second resist film 13 and the first resist film 12 may be removed by dry etching. Also in this case, the same effect as mentioned above can be obtained.

Figure 10:
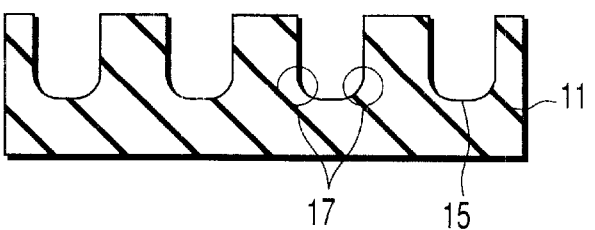
FIG. 10 is a cross-sectional view of a semiconductor device in which a trench has rounded edge portions at the bottom.
Figure 11:
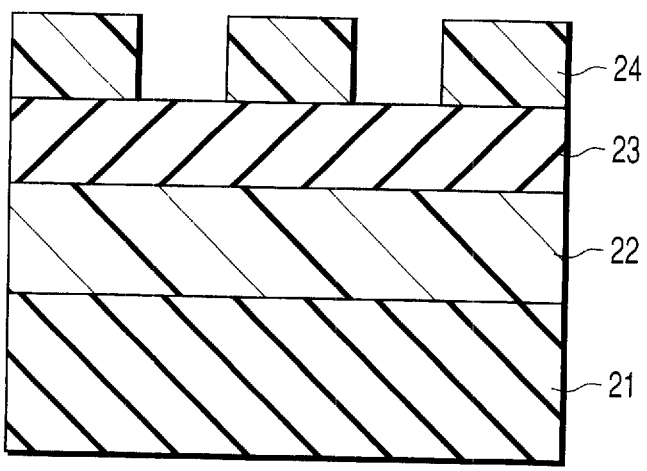
FIG. 11 is a cross-sectional view showing a manufacturing step of a semiconductor device according to a conventional technique.
Figure 12:
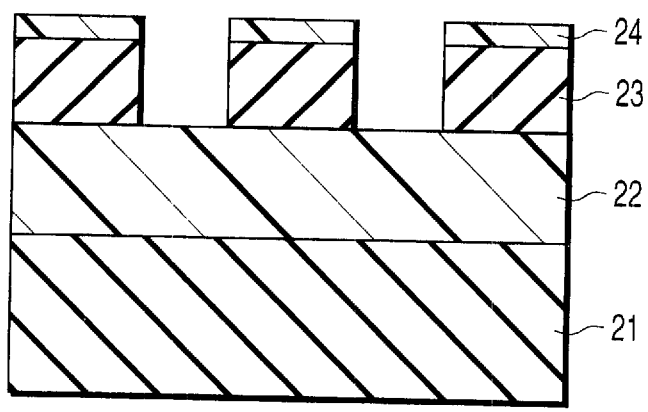
FIG. 12 is a cross-sectional view showing a manufacturing step following FIG. 11 of the semiconductor device according to the conventional technique.
Figure 13:
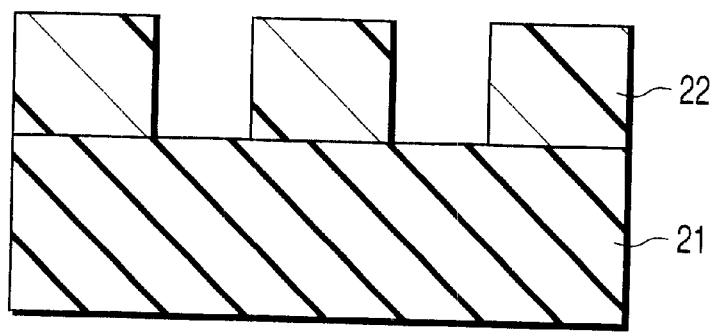
FIG. 13 is a cross-sectional view showing a manufacturing step following FIG. 12 of the semiconductor device according to the conventional technique.
Figure 14:
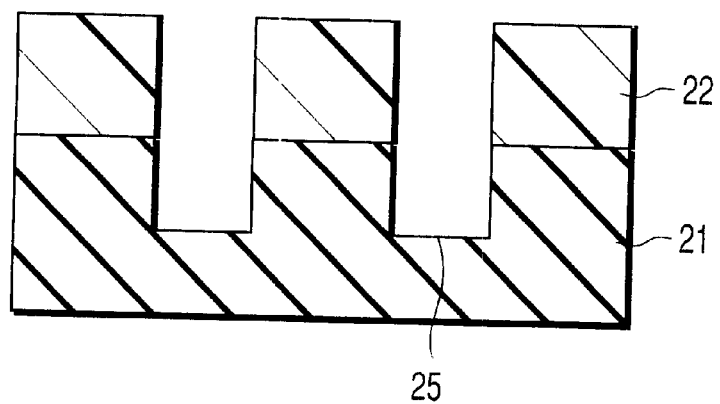
FIG. 14 is a cross-sectional view showing a manufacturing step following FIG. 13 of the semiconductor device according to the conventional technique.

Furthermore, the present invention can be applied to the case where the trench 15 has a rounded edge portion 17, as shown in FIG. 10. In this case, the same effect as mentioned above can be also obtained.

The present invention has been explained by taking the case where the desired trench 15 is formed in the insulating film 11, as an example. The present invention may be applied to not only a contact hole formation step but also to all processing steps for forming a pattern using a metal film such as Al, Al—Si—Cu, W, WSi as a mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:
    forming a first organic layer on an insulating film;
    forming a second organic layer on the first organic layer;
    patterning the second organic layer;
    forming a silicon oxide film or a metal-containing inorganic film on an entire surface of the patterned second organic layer, thereby covering the second organic layer;
    removing the silicon oxide film or the metal-containing inorganic film, the second organic layer, and the first organic layer, by dry etching, thereby patterning the first organic layer and the silicon oxide film or the metal-containing inorganic film;
    removing the silicon oxide film or the metal containing inorganic film and the insulating film by using the patterned first organic layer as a mask, thereby exposing the surface of the patterned first organic layer and simultaneously forming a trench in the insulating film; and
    removing the first organic layer.

2. The method according to claim 1, further comprising a step of forming an anti-reflection film on the first organic layer after the first organic layer is formed.

3. The method according to claim 1, further comprising a step of forming an anti-reflection film on the first organic layer after the first organic layer is formed, said anti-reflection film being an organic anti-reflection film formed of one element selected from the group consisting of flare, silk, polyimide, fluorocarbon, and tri-acetylene.

4. The method according to claim 1, wherein the first organic layer is formed of one element selected from the group consisting of a resist film, a coating-type carbon film, a sputtering-type carbon film, and a low dielectric film.

5. The method according to claim 1, further comprising a step of forming an anti-reflection film on the first organic layer after the first organic layer is formed, the first organic layer being formed of one element selected from the group consisting of a resist film, a coating-type carbon film, a sputtering-type carbon film, and a low dielectric film.

6. The method according to claim 1, wherein the silicon oxide film is one selected from the group consisting of an SOG film, coating-type organic silicon oxide film, coating-type organic silicon film, and coating-type inorganic silicon film.

7. The method according to claim 1, further comprising a step of forming an anti-reflection film on the first organic layer after the first organic layer is formed, wherein
    the silicon oxide film is one selected from the group consisting of an SOG film, coating-type organic silicon oxide film, coating-type organic silicon film, and coating-type inorganic silicon film.

8. The method according to claim 1, wherein the metal-containing inorganic layer is a coating-type inorganic layer containing at least one metal selected from the group consisting of $WO_3$, $Al_2O_3$, $TiO_2$, and TiN.

9. The method according to claim 1, further comprising a step of forming an anti-reflection film on the first organic layer after the first organic layer is formed, wherein
    the metal-containing inorganic layer is a coating-type inorganic layer containing at least one metal selected from the group consisting of $WO_3$, $Al_2O_3$, $TiO_2$, and TiN.

10. The method according to claim 1, further comprising a step of irradiating an entire surface of the patterned second organic layer with ultraviolet rays after the second organic layer is patterned.

11. The method according to claim 1, further comprising
    a step of forming an anti-reflection film on the first organic layer after the first organic layer is formed; and
    a step of irradiating the entire surface of the patterned second organic layer with ultraviolet rays after the second organic layer is patterned.

12. The method according to claim 1, wherein the second organic layer is a negative resist film.

13. The method according to claim 1, further comprising a step of forming an anti-reflection film on the first organic layer after the first organic layer is formed, wherein
    said second organic layer is a negative resist film.

14. The method according to claim 1, wherein the second organic layer is patterned by electron beam drawing.

15. The method according to claim 1, further comprising a step of forming an anti-reflection film on the first organic layer after the first organic layer is formed, wherein
    said second organic layer is patterned by electron beam drawing.

16. The method according to claim 1, wherein the second organic layer is thinner than the first organic layer.

17. The method according to claim 1, further comprising a step of forming an anti-reflection film on the first organic layer after the first organic layer is formed, wherein
    the second organic layer is thinner than the first organic layer.

* * * * *